US012522919B2

(12) United States Patent
Lucas

(10) Patent No.: US 12,522,919 B2
(45) Date of Patent: Jan. 13, 2026

(54) PLASMA COATING METHOD AND PLASMA COATING SYSTEM

(71) Applicant: INNOVATIVE COATING SOLUTIONS, Fernelmont (BE)

(72) Inventor: Stéphane Lucas, Fernelmont (BE)

(73) Assignee: INNOVATIVE COATING SOLUTIONS, Fernelmont (BE)

( * ) Notice: Subject to any disclaimer, the term of this patent is extended or adjusted under 35 U.S.C. 154(b) by 0 days.

(21) Appl. No.: 18/838,634

(22) PCT Filed: Feb. 17, 2023

(86) PCT No.: PCT/EP2023/054079
§ 371 (c)(1),
(2) Date: Aug. 15, 2024

(87) PCT Pub. No.: WO2023/156617
PCT Pub. Date: Aug. 24, 2023

(65) Prior Publication Data
US 2025/0163574 A1 May 22, 2025

(30) Foreign Application Priority Data
Feb. 17, 2022 (EP) .................................... 22157225

(51) Int. Cl.
*C23C 16/455* (2006.01)
*C23C 16/44* (2006.01)
*C23C 16/50* (2006.01)

(52) U.S. Cl.
CPC ........ *C23C 16/455* (2013.01); *C23C 16/4417* (2013.01); *C23C 16/50* (2013.01)

(58) Field of Classification Search
None
See application file for complete search history.

(56) References Cited

U.S. PATENT DOCUMENTS

2005/0211264 A1 9/2005 Kostenko et al.
2019/0194809 A1* 6/2019 Holm .................. C23C 16/4412
2021/0142988 A1 5/2021 Matsuura

OTHER PUBLICATIONS

International Search Report and Written Opinion for PCT Application No. PCT/EP2023/054079, dated Jun. 6, 2023, 10 pages.

* cited by examiner

*Primary Examiner* — Michael G Miller
(74) *Attorney, Agent, or Firm* — Dickinson Wright PLLC

(57) ABSTRACT

The present disclosure relates to a method for coating a surface with a coating equipment. The receptacle which was used for shipping the surface to be coated to the location of the coating equipment and will be used for shipping the coated surface outside the location is also used as a coating drum inside the coating equipment. The present disclosure also relates to a coating equipment suitable to accommodate the receptacle which was used for shipping the surface to be coated to the location of the coating equipment and will be used for shipping the coated surface outside the location.

19 Claims, 4 Drawing Sheets

PLASMA COATING METHOD AND PLASMA COATING SYSTEM

CROSS-REFERENCE TO RELATED APPLICATION(S)

This present application is a national stage application of International Patent Application No. PCT/EP2023/054079, filed Feb. 17, 2023, which claims priority to European Patent Application No. 22157225.8 filed Feb. 17, 2022, the disclosures of which are hereby incorporated by reference in their entireties.

TECHNICAL FIELD

The disclosure relates to a method for coating a surface with a plasma, preferably a low pressure plasma.

BACKGROUND

It is known to coat a surface inside a coating equipment using a plasma, for example by chemical vapor deposition (CVD). To do so, the surface is brought to the location of the coating equipment, is placed in a receptacle of the coating equipment, the receptacle is pumped downed, a reaction gas is injected, and a plasma is created. The surface is then removed from the receptacle and shipped away.

The transfer of the surface to and from the coating equipment may be problematic. If the surface is on a light powder, it may fly away, which is a loss of material and may be unhealthy for the operator. If the surface comprises a material sensitive to oxygen, it may oxidize.

A known solution is to use a sealed transfer system between the receptacle used for transport and the drum used for the coating. However, such a system is complex, and its use is cumbersome, and time-consuming.

SUMMARY

An object of the disclosure is to provide a safe and reliable way to place the surface to be coated in the coating equipment.

To fulfill this object, the disclosure provides a method for coating a surface with a coating equipment, the method comprising the steps of:

(a) bringing a container containing the surface to a location of the coating equipment, the container comprising a receptacle having an opening, and a cap closing the opening;

(b) holding the receptacle with a holder of the coating equipment;

(c) opening the receptacle;

(d) applying a plasma coating to the surface inside the contained, which includes:

pumping gas out of the receptacle with a pumping system of the coating equipment;

injecting a reaction gas in the receptacle with a gas injection system of the coating equipment;

rotating the receptacle;

generating a plasma inside the receptacle with an electrode setup of the coating equipment in order to coat the surface with at least one component obtained from the reaction gas;

(e) closing the receptacle;

(f) removing the receptacle from the holder; and (g) bringing the receptacle out of the location of the coating equipment.

In the method according to the disclosure, the plasma coating occurs within the receptacle that was used for bringing the surface at the location of the coating equipment and for surface the element out of the location of the coating equipment. There is no need of any transfer of the surface. In other words, the receptacle is used as a coating drum.

The sub-steps of the plasma coating step (pumping, injecting the reaction gas, rotating the receptacle, generating the plasma) may start and/or stop with a time shift. There is a least one period of time while they are all performed simultaneously. At least one of them (the pumping for example), may start before the step of holding the receptacle with a holder and/or may stop after the step of removing the receptacle from the holder.

At least one of the sub-steps of step (d) may be repeated before moving to step (e). For example, a first reaction gas may be injected to create a first coating layer, then, a second reaction gas may be injected to create a second coating layer on top of the first coating layer.

The plasma coating may use PECVD plasma discharge. The coating may be used for functionalization or encapsulation. The reaction gases may comprise cyclopropylamine, acetylene, methane, HMDSO, TMDSO, possibly mixed with $O_2$, $N_2$, Ar, He, $H_2$. Any gas suitable for plasma CVD may be used.

The container may be called "shipment container".

The location is preferably a building or a room.

The gas pumped out of the receptacle may be called the "initial shipment gas". It may be air, or any gas used for the transport. The vacuum created by the pumping does not have to be perfect.

Step (a) occurs before each of steps (b) to (g); step (g) occurs after each of steps (a) to (f).

The opening and/or the closing of the receptacle may be done by a user or automatically. The opening of the receptacle opens, at least partially, the opening. The closing of the receptacle closes, at least partially the opening and any opening of the receptacle, in order to obtain a hermetically closed container to bring out of the location of the coating equipment. It is also possible to close the receptacle with a portable pumping system and to bring the receptacle connected to this portable pumping system out of the location of the coating equipment.

A gasket may be placed between the receptacle and the cap and/or the temporary stopper to improve the sealing.

In an embodiment, the opening of the receptacle includes removing the cap from the opening. It is also possible that the cap that was used for bringing the receptacle to the location is perforated before the plasma coating, and replaced by a hermetic cap or closed after the plasma coating. It is also possible that the receptacle is perforated before the plasma coating, and closed after the plasma coating.

In an embodiment, the method further comprises, after the opening of the receptacle and before the plasma coating, a step of closing, at least partially, the opening with a temporary stopper comprising an injection through-hole to inject the reaction gas in the receptacle. The temporary stopper may be for example a perforated cap.

After the coating, the temporary stopper may be replaced by the cap or by another stopper. The temporary stopper may comprise or may be surrounded by an extraction channel for letting the initial shipment gas leave the receptacle.

In an embodiment, the method further comprises placing a first electrode of the electrode setup in the receptacle through the injection through-hole. Other options would be to have a second through-hole for the first electrode or to place the first electrode in another way.

In an embodiment, the method further comprises placing a first electrode of the electrode setup in the receptacle. The first electrode is connectable to a first wire of the electrode setup.

In an embodiment, the surface coated during step (d) is, at least partially, on an internal surface of the receptacle. For example, the receptacle may be provided for containing a liquid. It may be a syringe or a bottle.

In an embodiment, the surface coated during step (d) is, at least partially, on an element located inside the receptacle during steps (a) to (g)

The element may be, for example, an object or a powder. It may comprise nano or micro particles; and/or (possibly tangled) one-dimensional structures like filaments, carbon nanotubes, metallic wires; and/or two-dimensional nano or micro structures like graphene. It may be solid. It may be porous, for example it may comprise a foam. Several elements and/or surfaces may be coated simultaneously by a method according to the disclosure In an embodiment, a blade hits the element during the rotation of the receptacle. There is preferably a plurality of blades. The blade(s) may be part of the receptacle or may be introduced inside the receptacle. The blade(s) increase(s) the motion of the element during the rotation.

In an embodiment, the method comprises a step of introducing the blade within the receptacle. This introduction may be performed before or after the receptacle is held by the holder. The blade may stay inside the receptacle for bringing the container out of the location or may be removed.

In an embodiment, the opening is located at a first horizontal end of the receptacle during the plasma generation.

In an embodiment, the receptacle has a bottleneck. The bottleneck helps maintaining the cap and/or keeping the element in the receptacle during the rotation. The bottleneck is optional: the receptacle may have straight walls between its two extremities.

In an embodiment, the receptacle has a thread around the opening, and the cap has a corresponding thread. If a temporary stopper is used, it preferably has also a corresponding thread.

In an embodiment, the method comprises a step of injecting a final shipment gas in the receptacle between step (d) and step (g). The final shipment gas is preferably without oxygen. It may comprise nitrogen, helium and/or argon. Another option is to maintain the vacuum inside the receptacle. It prevents oxidation of the coated surface.

In an embodiment, the receptacle is conductive and electrically connected by a second wire of the electrode setup. The receptacle forms the counter electrode for the plasma generation. The second wire is preferably connected to the holder, which is conductive and connected to the receptacle.

The disclosure also relates to a coating system comprising a receptacle containing a surface to be coated and a coating equipment comprising:

- a holder,
- a motor arranged for rotating the receptacle held by the holder,
- a pumping system arranged to pump gas out of the receptacle held by the holder,
- a gas injection system arranged to inject a reaction gas in the receptacle held by the holder,
- an electrode setup comprising a first wire, a second wire and a voltage source connected to the first wire and the second wire, the electrode setup being arranged to create a difference of potential inside the receptacle held by the holder characterized in that the holder holds the receptacle in a releasable way.

The holder is configured to hold the receptacle in such way that the receptacle can be removed while keeping the surface inside the receptacle. Preferably, said receptacle has an opening that is closed with a cap or a stopper. If desired, said receptacle opening can be hermetically closed in order to obtain a hermetically closed receptacle or at least partially closed. More preferably, said stopper can be a temporary stopper such as the temporary stopper described above or a temporary stopper as illustrated on FIG. 2. Said temporary stopper preferably comprises an injection through-hole to inject the reaction gas in the receptacle. Preferably, a first electrode of the electrode setup in the receptacle is placed through the injection through-hole. The cap may be for example a perforated cap or the cap 40 illustrated on FIG. 1 or a hermetic cap.

The disclosure also relates to a vehicle comprising a receptacle which is conductive and contains a surface coated by a method wherein the receptacle is electrically connected by a second wire of the electrode setup. The vehicle may comprise wheels, may be a boat or an aircraft. The vehicle is outside the location of the coating equipment.

BRIEF DESCRIPTION OF THE DRAWINGS

For a better understanding of the present disclosure, reference will now be made, by way of example, to the accompanying drawings in which.

DETAILED DESCRIPTION

Figure 1:
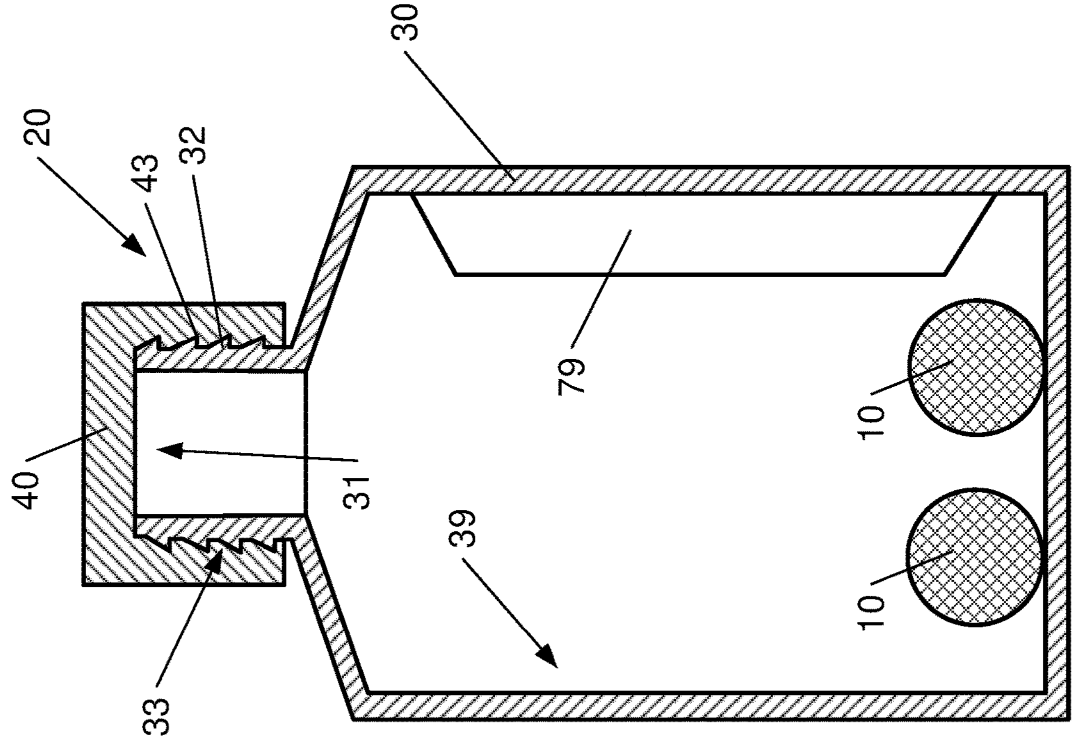
FIG. 1 illustrates a container containing two elements to be coated.

The present disclosure will be described with respect to particular embodiments and with reference to certain drawings but the disclosure is not limited thereto. The described functions are not limited by the described structures. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression “a device comprising A and B” should not be limited to devices consisting only of components A and B, rather with respect to the present disclosure, the only enumerated components of the device are A and B.

On the figures, identical or analogous elements may be referred by a same number.

FIG. 1 illustrates a container 20 containing two elements 10 to be coated. In this illustration, the elements 10 are solid objects. The container 20 comprises a receptacle 30 having an opening 31, and a cap 40 closing the opening 31. The cap 40 may be removably attached to the receptacle 30 with screws for example or with a thread mechanism: the receptacle 30 has a thread 33 around the opening 31 and the cap 40 has corresponding thread 43. The cap 40 is preferably attached to a bottleneck 32 of the receptacle 30. The receptacle 30 may be conductive, for example in aluminum. The container 20 comprises an initial shipment gas. One or more blade(s) 79 may be attached, possibly removably, to an internal surface 39 of the receptacle 30. The internal surface 39 may be coated during the plasma coating, instead of the element 10 or in addition to the element 10.

Figure 2:
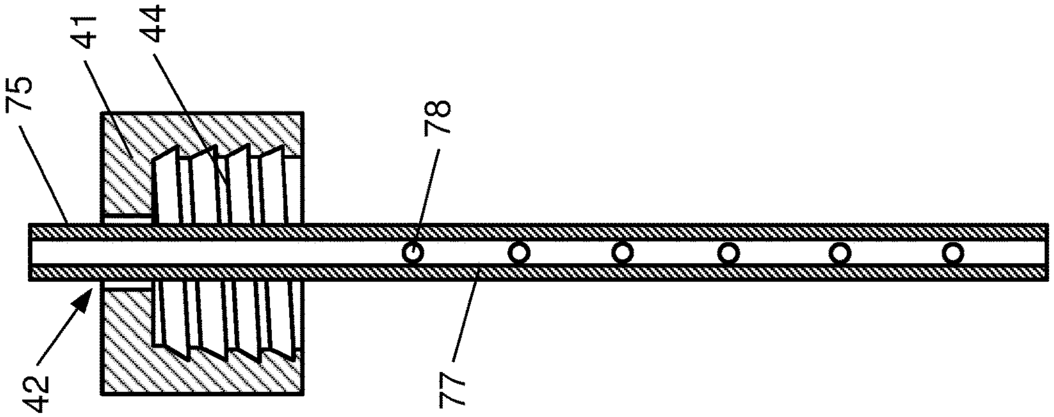
FIG. 2 illustrates a temporary stopper and a first electrode.

FIG. 2 illustrates possible respective positions of a temporary stopper 41 and a first electrode 75. The temporary stopper 41 may be placed on the opening 31 instead of the cap 40. The temporary stopper 41 may comprise a thread 44 corresponding to the thread 33 of the receptacle 30. The temporary stopper 41 preferably comprises an injection through-hole 42. The first electrode 75 is designed to located, at least partially, inside the receptacle 30. The first electrode 75 may be placed across the temporary stopper 41, preferably through the injection through-hole 42. The injection through-hole 42 is preferably wider than the first electrode 75: the space around the first electrode 75 forms an extraction channel to pump the gas out of the receptacle 30. In another embodiment, not shown, the first electrode 75 is placed across the cap 40. The first electrode 75 may be used to inject a reaction gas in the receptacle 30. It may comprise a longitudinal hole 77 and, preferably, radial holes 78 to inject the reaction gas in the receptacle 30.

Figure 3:
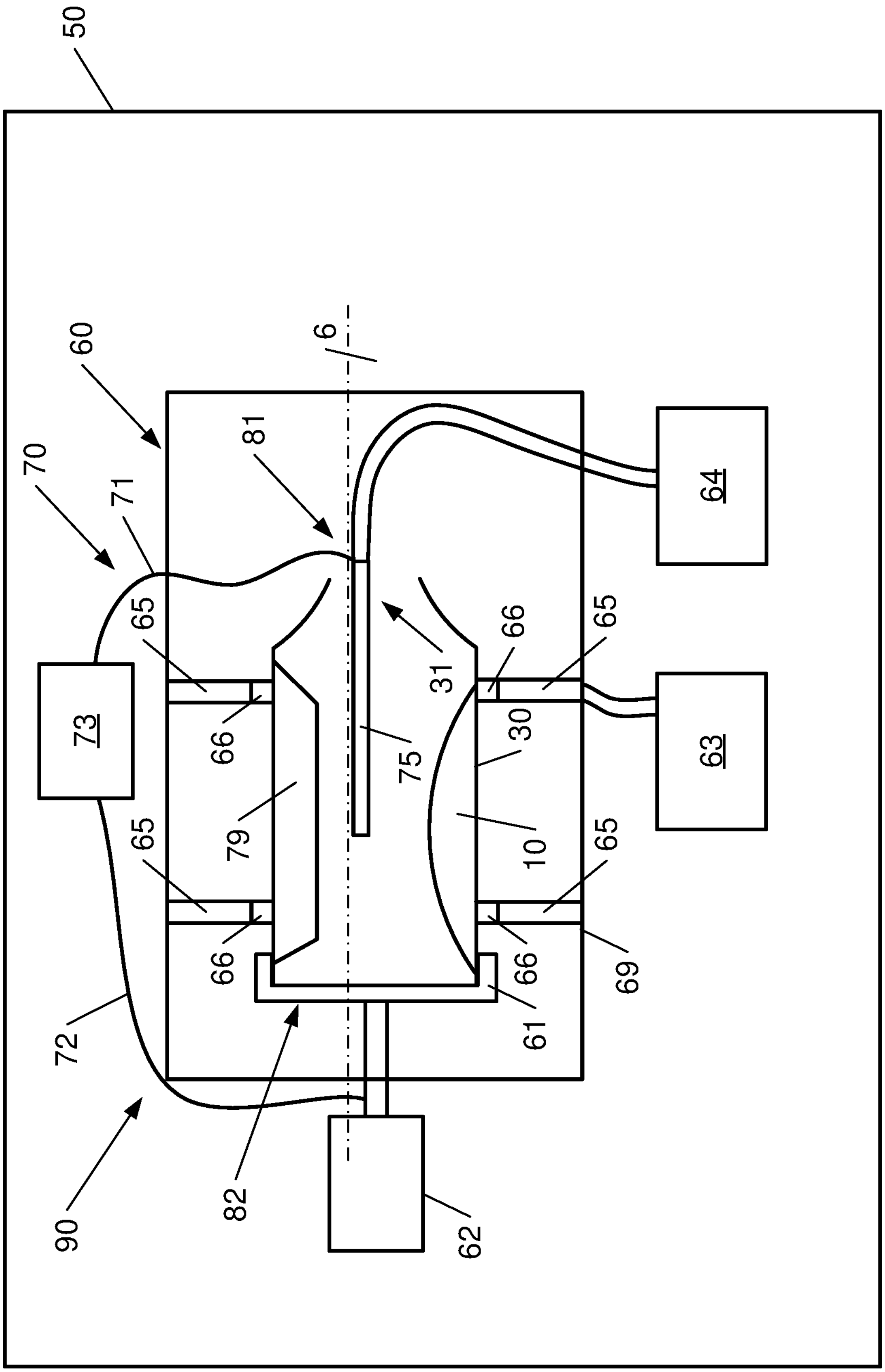
FIG. 3 illustrates a coating system according to an embodiment of the disclosure.

FIG. 3 illustrates a coating system 90 according to an embodiment of the disclosure. The coating system 90 comprises the receptacle 30, preferably partially closed with the temporary stopper 41. The receptacle 30 contains the surface to be coated, for example the element 10, which in this illustration is a powder. The coating system 90 comprises a coating equipment 60. The coating system 90 is configured in such a way that receptacle 30 containing the surface may be placed in the coating equipment 60 and removed from the coating equipment 60. The coating equipment 60 is located in a location 50 during the plasma coating.

The coating equipment 60 comprises a holder 61 configured for holding the receptacle 30 in a releasable way. The holder 61 may comprises a clamp, a thread, springs, pushing blades and/or any other attachment mechanism to removably hold the receptacle 30. The holder 61 configured for holding the receptacle 30 in such a way that the opening 31 is at a first horizontal end 81 of the receptacle 30 and the holder 61 comprises at least a part at a second horizontal end 82 of the receptacle 30.

The coating equipment 60 comprises a motor 62 arranged for rotating the receptacle 30 held by the holder 61. The rotation is preferably around a horizontal axis 6. The receptacle 30 may contain one or more blade(s) 79 arranged for hitting the element 10 during the rotation. The blade(s) 79 may be removable, or not, with respect to the receptacle 30. The blade(s) 79 are attached to the internal surface 39 of the receptacle 30, at least during the rotation.

The coating equipment 60 comprises a pumping system 63 arranged to pump initial shipment gas out of the receptacle 30 held by the holder 61. The pumping system 63 preferably pumps down the gas out of a chamber 69 of the coating equipment 60 where the receptacle 30 and the holder 61 are placed. To extract the gas from inside the receptacle 30, extraction channels make a fluidic communication between the interior of the receptacle 30 and the exterior. They are preferably in the temporary stopper 41. The motor 62 may be inside or outside the chamber 69.

The coating equipment 60 comprises an electrode setup 70 comprising a first wire 71, a second wire 72, and a voltage source 73 connected to the first wire 71 and the second wire 72. The electrode setup 70 creates a difference of potential inside the receptacle 30 held by the holder 61 in order to generate a plasma therein. It may comprise the first electrode 75 located inside the receptacle 30. The first electrode 75 may be, or not, along the rotation axis 6. The applied voltage may be DC, MF or RF.

In a first embodiment of the disclosure, the first wire 71 is connected to the first electrode 75; and the receptacle 30 is conductive and connected to the second wire 72. In a second embodiment of the disclosure, wherein the receptacle 30 is not conductive, the first wire 71 is connected at a first side of a coil winding around the receptacle 30 and the second wire 72 is connected at a second side of the coil in order to generate an inductive plasma through radio-frequencies. This second embodiment is preferably used when the surface to be coated is the internal surface 39 of the receptacle 30 and the receptacle 30 is non-conductive. The receptacle 30 may be for example in glass or in polymer.

The coating equipment 60 comprises a gas injection system 64 arranged to inject a reaction gas in the receptacle 30 held by the holder 61. The reaction gas may be injected through the first electrode 75 if it is tubular, or by another nozzle.

The receptacle 30 may be supported by a support system comprising supports 65, preferably with bearings 66, in order to hold it during the rotation. The supports 65 are electrically insulating.

Figure 4:
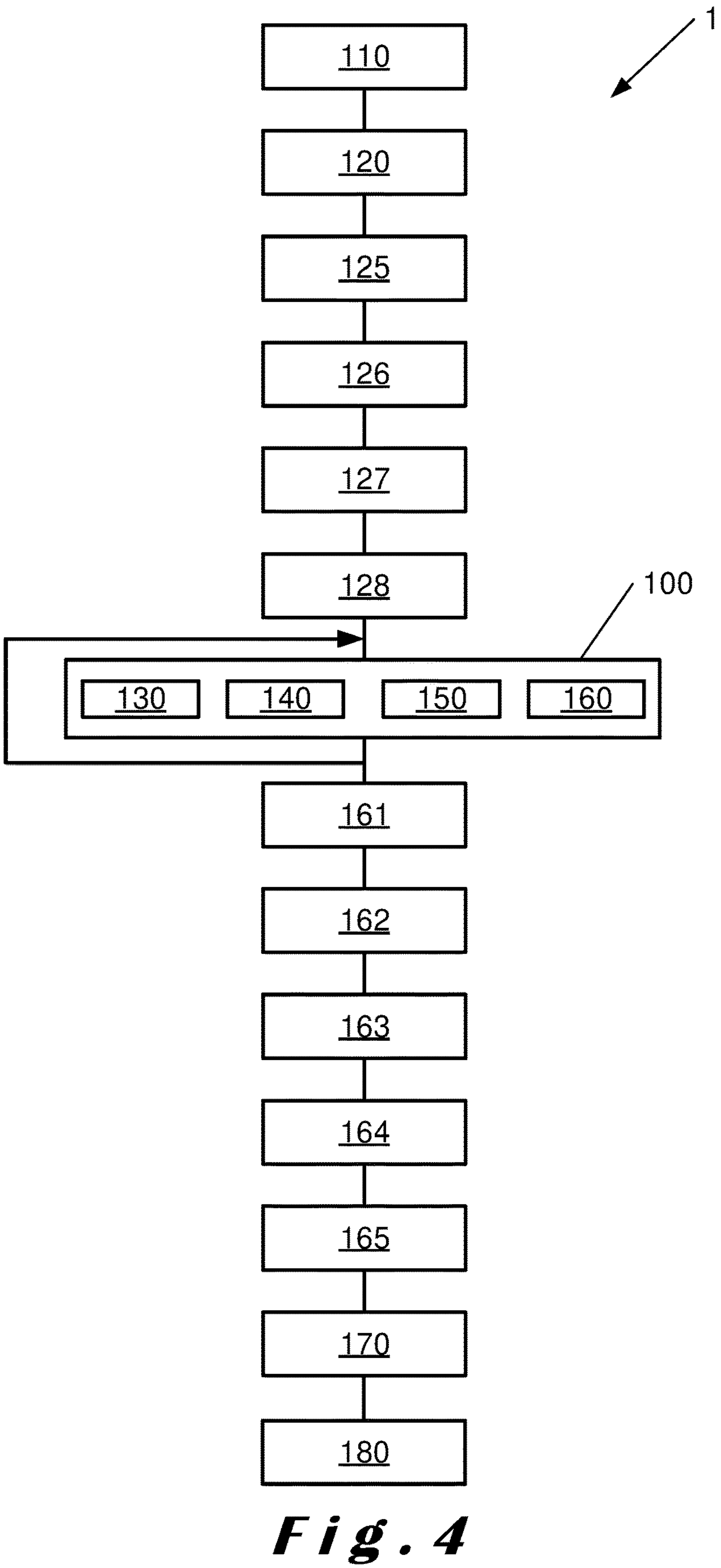
FIG. 4 is a flowchart of a method according to an embodiment of the disclosure.

FIG. 4 is a flowchart of a method 1 in an embodiment of the disclosure.

The container 20 containing the surface to be coated is brought 110 to the location 50 of the coating equipment 60. The receptacle 30 is placed 120 in the coating equipment 60 in such a way that the holder 61 holds it. The receptacle 30 is opened 125, preferably by removing the cap 40 from the opening 31. The blade(s) 79 may be introduced 126 inside the receptacle 30 and attached therein. The temporary stopper 41 may be placed 127 at the position previously occupied by the cap 40. Any of steps 125, 126, 127 may be performed before the receptacle 30 is placed 120 in the coating equipment 60.

Before or after placing 127 the temporary stopper 41, the first electrode 75 may be placed 128, at least partially, inside the receptacle 30. It is also possible that the first electrode 75 is located across the temporary stopper 41 when it is placed 127.

Once the coating system 90 is set up, the plasma coating 100 of the surface is performed. The plasma coating 100 includes the following steps, are performed at least partially simultaneously. The gas initially present in the receptacle 30 is pumped 130 out of the receptacle 30. A reaction gas is injected 140 in the receptacle 30. The receptacle 30 is rotated 150. The electrode set up generates 160 a plasma in the receptacle 30. These steps 130, 140, 150, 160 result in a coating of the surface with at least one component obtained from the reaction gas.

In an embodiment of the disclosure, at least one of steps 130, 140, 150, 160 is done several times, with various settings. For example, the rotation 150 may be stopped and restarted. It is also possible that several reaction gases are injected 140 one after each other to obtain overlapping coating layers on the surface.

A final shipment gas may then be injected 161 inside the receptacle 30, for example through the injection through-hole 42. The first electrode 75 may be removed 162, and, possibly simultaneously, the temporary stopper 41 may be removed 163 from the opening 31. The blade(s) may also be removed 164. The receptacle 30 is closed 165. The cap 40 which was used to bring the container 20 or another hermetic cap or a cap connected to a portable pumping system may be placed to close the opening 31. Other ways of closing the receptacle 30, preferably hermetically, is possible within the frame of the present disclosure. The closed receptacle 30 comprises the coated surface. It may have been pumped down or may be pumped down with a portable pumping system to have vacuum inside.

The receptacle 30 is removed 170 from the holder 61. Any of steps 161, 162, 163, 164, 165 may be performed after the receptacle 30 is removed 170 from the holder 61. Step 161 may be performed between step 162 and 165.

Then, the receptacle 30 containing the coated surface, for example to coated element 11, is brought 180 outside the location 50 of the coating equipment 60.

A sealed box, with vacuum or neutral atmosphere, may be placed around the receptacle 30 between its opening 125 and the pumping 130 and/or between the stoppage of the pumping 130 and the closing 165 of the receptacle. In an embodiment of the disclosure, the removal 162 of the first electrode 75 is performed using the sealed box (the receptacle 30 may still be held by the holder 61 or may not), and the cap for shipping (possibly connected to a portable pumping system) is placed to close the opening 31 using the sealed box. The sealed box is preferably around an opening of the chamber 69. The sealed box is preferably a glove box.

Any order of the steps is possibly within the frame of the disclosure, except that

- the step of bringing 110 the container 20 containing the surface to the location 50 of the coating equipment 60 should occur before the other steps; and
- the step of bringing 180 the receptacle 30 out of the location 50 of the coating equipment 60 should occur after the other steps.

Figure 5:
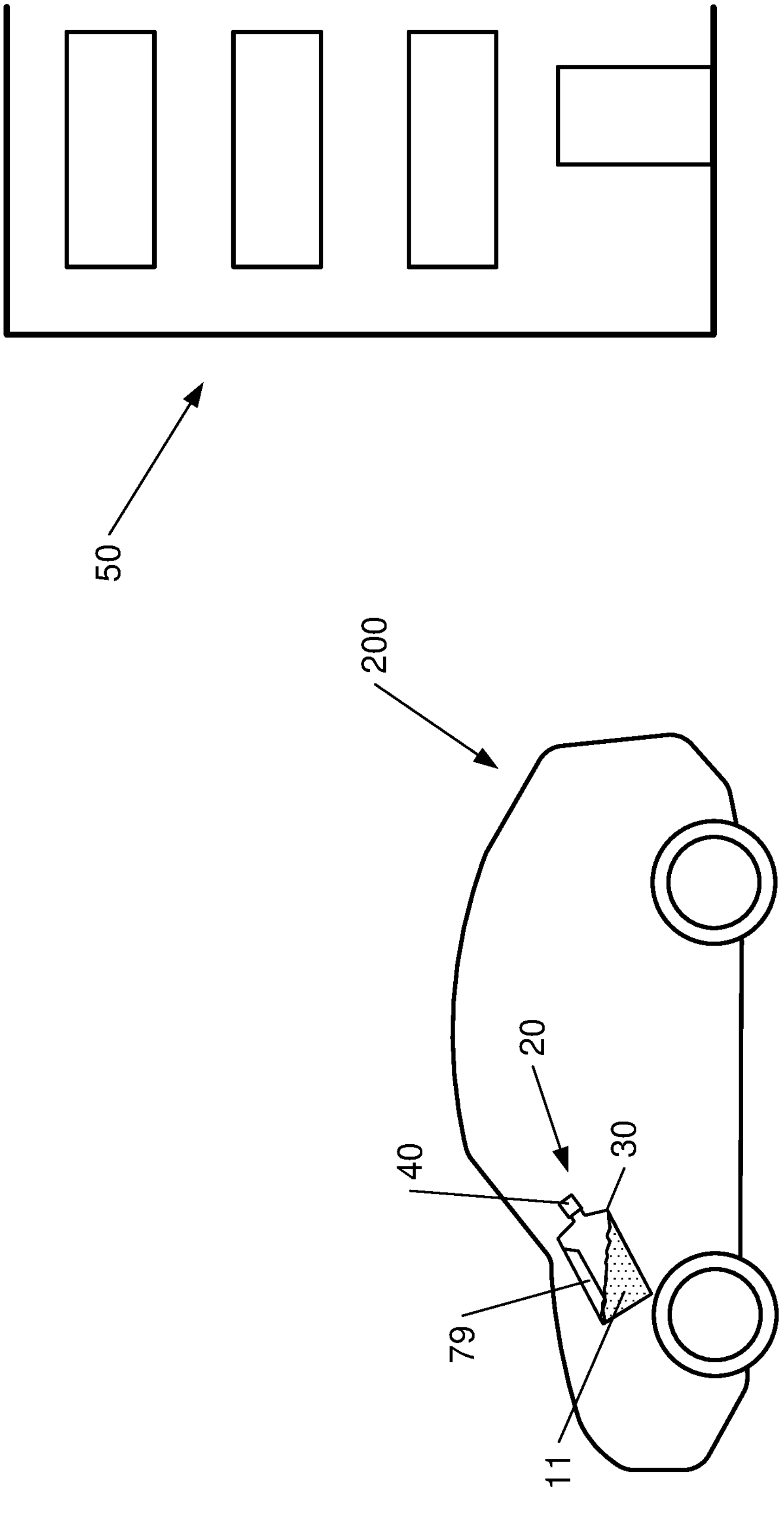
FIG. 5 illustrates a vehicle comprising a receptacle.

FIG. 5 illustrates a vehicle 200 comprising the receptacle 30 containing the coated surface (for example the coated element 11) moving away from the location 50.

In other words, the disclosure relates to a method for coating a surface (with may be an element 10) with a coating equipment 60. The receptacle 30 which was used for shipping the surface to be coated to the location 50 of the coating equipment 60 and will be used for shipping the coated surface outside said location 50 is also used as a coating drum inside the coating equipment 60. The present disclosure also relates to a coating equipment 60 suitable to accommodate the receptacle 30 which was used for shipping the surface to the location 50 of the coating equipment 60 and will be used for shipping the surface outside said location 50.

Although the present disclosure has been described above with respect to particular embodiments, it will readily be appreciated that other embodiments are also possible.

The invention claimed is:

1. A method for coating a surface with a coating equipment, the method comprising the steps of:

(a) bringing a container containing the surface to a location of the coating equipment, the container comprising a receptacle having an opening, and a cap closing the opening;

(b) holding the receptacle with a holder of the coating equipment;

(c) opening the receptacle;

(d) applying a plasma coating to the surface inside the container, which includes:

pumping gas out of the receptacle with a pumping system of the coating equipment;

injecting a reaction gas in the receptacle with a gas injection sy2tem of the coating equipment;

rotating the receptacle; and generating a plasma inside the receptacle with an electrode setup of the coating equipment in order to coat the surface with at least one component obtained from the reaction gas;

(e) closing the receptacle;

(f) removing the receptacle from the holder; and (g) bringing the receptacle out of the location of the coating equipment.

2. The method according to claim 1, wherein the opening of the receptacle includes removing the cap from the opening.

3. The method according to claim 2, further comprising, after the opening of the receptacle and before the plasma coating, a step of closing, at least partially, the opening with a temporary stopper comprising an injection through-hole to inject the reaction gas in the receptacle.

4. The method according to claim 2, further comprising placing a first electrode of the electrode setup in the receptacle.

5. The method according to claim 1, further comprising, after the opening of the receptacle and before the plasma coating, a step of closing, at least partially, the opening with a temporary stopper comprising an injection through-hole to inject the reaction gas in the receptacle.

6. The method according to claim 5, further comprising placing a first electrode of the electrode setup in the receptacle through the injection through-hole.

7. The method according to claim 5, further comprising placing a first electrode of the electrode setup in the receptacle.

8. The method according to claim 1, further comprising placing a first electrode of the electrode setup in the receptacle.

9. The method according to claim 1, wherein the surface is, at least partially, an internal surface of the receptacle.

10. The method according to claim 1, wherein the surface is, at least partially, on an element located inside the receptacle during steps (a) to (g).

11. The metho according to claim 10, wherein the element comprises a powder or an object.

12. The method according to claim 11, wherein a blade hits the element during a rotation of the receptacle.

13. The method according to claim 10, wherein a blade hits the element during a rotation of the receptacle.

14. The method according to claim 13, comprising a step of introducing the blade within the receptacle.

15. The method according to claim 1, wherein the receptacle has a bottleneck.

16. The method according to claim 1, further comprising a step of injecting a final shipment gas in the receptacle between step (d) and step (g).

17. The method according to claim 1, wherein the receptacle is conductive and electrically connected by a second wire of the electrode setup.

18. A vehicle comprising a receptacle which is conductive and contains a surface coated by the method according to claim 17.

19. A coating system comprising a receptacle containing a surface to be coated and a coating equipment comprising:

a holder, a motor arranged for rotating the receptacle held by the holder a pumping system arranged to pump gas out of the receptacle held by the holder, a gas injection system arranged to inject a reaction gas in the receptacle held by the holder, an electrode setup comprising a first wire, a second wire and a voltage source connected to the first wire and the second wire, the electrode setup being arranged to create a difference of potential inside the receptacle held by the holder, wherein the holder holds the receptacle in a releasable way and in that the receptacle has an opening closed at least partially with a temporary stopper comprising an injection through-hole or closed by a cap.

* * * * *